United States Patent
Van Der Vorst

(10) Patent No.: US 6,912,947 B2
(45) Date of Patent: Jul. 5, 2005

(54) SUPPORTING DEVICE

(75) Inventor: Petrus Godefriedus Van Der Vorst, Nederweert (NL)

(73) Assignee: Assembleon N.V., Eindhoven (NL)

( * ) Notice: Subject to any disclaimer, the term of this patent is extended or adjusted under 35 U.S.C. 154(b) by 231 days.

(21) Appl. No.: 10/270,949

(22) Filed: Oct. 15, 2002

(65) Prior Publication Data

US 2003/0085333 A1 May 8, 2003

(30) Foreign Application Priority Data

Oct. 19, 2001 (EP) .............................................. 01204001

(51) Int. Cl.$^7$ .............................................. H05K 13/00
(52) U.S. Cl. .............................................. 92/19; 92/28
(58) Field of Search .............................. 92/15, 18, 19, 92/20, 23, 27, 28

(56) References Cited

U.S. PATENT DOCUMENTS

| | | | | |
|---|---|---|---|---|
| 3,251,278 A | * | 5/1966 | Royster | 92/18 |
| 3,320,861 A | * | 5/1967 | Johnson et al. | 92/14 |
| 4,907,491 A | * | 3/1990 | Filip | 92/20 |
| 6,178,870 B1 | * | 1/2001 | Takahashi | 92/28 |
| 6,615,703 B2 | * | 9/2003 | Kendall | 92/28 |
| 6,631,670 B2 | * | 10/2003 | Baruffaldi | 92/28 |

FOREIGN PATENT DOCUMENTS

| | | | | |
|---|---|---|---|---|
| WO | WO 9730291 A1 | * | 8/1997 | F15B/15/26 |
| WO | 0008905 A2 | | 2/2000 | H05K/13/00 |
| WO | WO0008905 | | 2/2000 | H05K/13/00 |
| WO | 0106823 A1 | | 1/2001 | H05K/13/00 |

* cited by examiner

Primary Examiner—Thomas E. Lazo
(74) Attorney, Agent, or Firm—Aaron Waxler

(57) ABSTRACT

The invention relates to a supporting device for supporting substrates in a component placement machine including a housing (1), a piston rod (5) arranged in the housing so as to be movable in its longitudinal direction in the housing (1) by pressurized fluid and having one end extending outside the housing (1) and a locking mechanism (7 to 9) by which displacement of the piston rod (5) in its longitudinal direction can be prevented. The locking mechanism (7 to 9) includes clamp (8) movable by an adjuster (7) in a direction transverse to the longitudinal direction of the piston rod (5) between an active position for blocking the piston rod (5) and an idle position in which the piston rod (5) is movable in its longitudinal direction. The clamp (8) have been arranged in the housing (1) so that in the active position said clamping means (8) directly engage the piston rod (5).

9 Claims, 1 Drawing Sheet

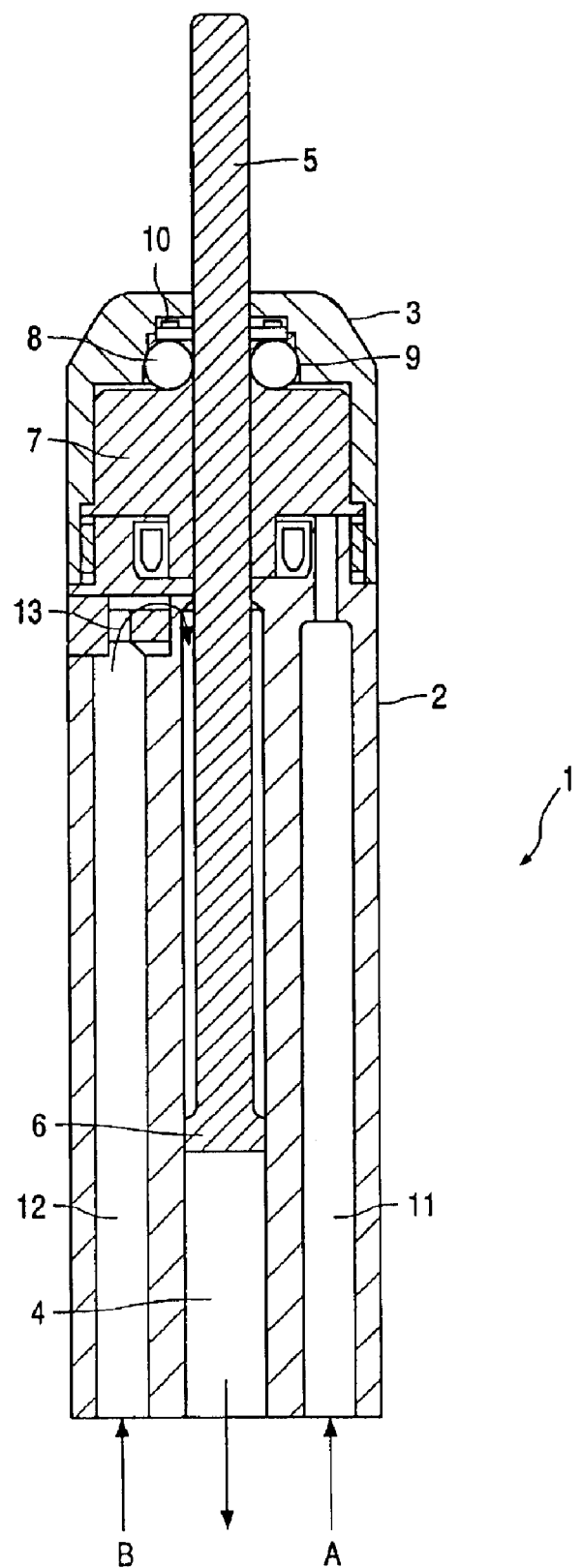

SUPPORTING DEVICE

The invention relates to a supporting device for supporting substrates in a component placement machine, which supporting device is provided with a housing, with a piston rod arranged in the housing and movable in its longitudinal direction by means of a pressurized fluid, one end of said piston rod projecting outside the housing, and with a locking mechanism by means of which a displacement of the piston rod in its longitudinal direction can be prevented, which locking mechanism is provided with clamping means displaceable transversely to the longitudinal direction of the piston rod by adjusting means between an active position, in which a displacement of the piston rod in its longitudinal direction is prevented, and an idle position, in which the piston rod can be displaced in its longitudinal direction.

Such a supporting device is known from the international patent application no. WO 00/08905. This publication describes how, for example, a number of such supporting devices are used for supporting objects, such as printed circuit boards, the piston rods of selected supporting devices being moved into positions supporting said object, whereas the piston rods of other supporting devices are kept in positions not supporting the object. The supporting device of the international patent application WO 00/08905 utilizes clamping members in the form of spherical balls which are provided adjacent the end of the piston rod remote from the end of the piston rod projecting outside the housing. If the piston rod is brought into a retracted position inside the housing not suitable for supporting an object, the clamping members may be brought into an active position locking the piston rod by means of a rod-shaped adjustment member which is situated in the extended direction of the piston rod and which is displaceable in longitudinal direction. In this known device, the piston rod can be locked against displacement in its longitudinal direction only in an idle position. Furthermore, the provision of the locking mechanism adjacent the end of the piston rod remote from the end projecting from the housing disadvantageously leads to a comparatively long construction of the supporting device.

According to the invention, by contrast, the clamping members are arranged in the housing such that they directly engage the piston rod in the active position of the clamping members.

When the construction according to the invention is used, the piston rod may be clamped in any position desired, i.e. also in a position supporting an object, whereby a stable support of the object can be realized. Furthermore, a compact construction of the supporting device can be realized thereby.

Preferably, the clamping members are located adjacent that end of the housing where the piston rod projects outside the housing, so that the piston rod is clamped as close as possible to its end projecting outside the housing.

A simple construction of the clamping mechanism can be realized if the clamping members are displaceable parallel to the longitudinal direction of the piston rod along a conical guide surface formed in the housing by means of a piston member located in the housing and displaceable by means of a pressurized fluid, which piston member bears on the clamping members.

The invention will be explained in more detail below with reference to the accompanying FIGURE in which an embodiment of a supporting device is diagrammatically shown in cross-section.

The supporting device shown comprises a housing 1 which is substantially composed of an elongate body 2 and a cap-shaped part 3 screwed onto an end of said body. A central bore 4 extending in the longitudinal direction of the elongate body 2 is provided in the body 2. A piston rod 5 is located in the bore 4 and is provided at one end with a piston 6 having a greater diameter than the piston rod 5. The external diameter of the piston 6 is slightly smaller than the internal diameter of the bore 4. As is apparent from the FIGURE, furthermore, the piston rod extends through the interior of the cap-shaped part 3 such that the end of the piston rod 5 remote from the piston 6 projects outside the housing 1.

A piston-shaped member 7 is located in a space situated above the elongate body 2, as seen in the FIGURE, and enclosed by the cap-shaped part 3. Clamping members in the form of balls 8 are enclosed, as seen in the FIGURE, between the upper limiting surface of the piston-shaped member 7 and a wall portion 9 which forms part of a cone shell whose apex is located at the side of the balls 8 remote from the piston-shaped member 7.

A spring 10 exerting a downwardly directed force on the balls 8, as seen in the FIGURE, rests on the sides of the balls remote from the piston-shaped member 7, which spring is enclosed between the balls 8 and a wall of the cap-shaped part 3.

The elongate body 2 further accommodates a channel 11 which extends parallel to the bore 4, which continues through the entire length of the elongate body 2, and which then issues into the space in the cap-shaped part 3 accommodating the piston-shaped body 7 at the side of this piston-shaped body 7 remote from the balls 8.

A further channel 12 extending through the elongate body 2 parallel to the bore 4 is in open communication via a passage 13 provided adjacent the cap-shaped part in the housing 1 with the portion of the bore 4 that accommodates the piston rod 5.

A conduit (not shown) in which a valve (also not shown) is mounted is connected to the channel 11. Opening and closing of said valve causes a supply of a pressurized fluid to the channel 11 at moments when this is desired, as indicated by an arrow A.

Similarly, a conduit (not shown) with a valve (not shown) is connected to the channel 12 so as to supply a pressurized fluid to the channel 12 at desired moments, as indicated with an arrow B.

Furthermore, a conduit (not shown) with a valve (again not shown) is connected to the end of the bore 4 remote from the cap-shaped part 3. Closing of this valve blocks the flow of fluid from the channel 4, whereas opening of this valve releases the flow of fluid from the channel 4.

The operation of the supporting device described above is as follows. When the valves or closing members accommodated in the conduits connected to the bore 4 and the channel 11 are open, and pressurized fluid is supplied to the channel 12, this fluid will flow into the portion of the bore 4 accommodating the piston rod 5 and thus exert a downward force, on the piston 6, so that the piston rod 5 will move down in the FIGURE. If a pressurized fluid is supplied to the channel 12 while the valve in the conduit connected to the bore 4 is closed, and the valve in the conduit connected to the channel 11 is open, the fluid flowing from the channel 12 into the bore 4 will move the piston rod 5 upwards, as seen in the FIGURE, because this fluid can also flow into the portion of the bore 4 situated below the piston 6, as seen in the FIGURE, owing to the clearance between the outer circumference of the piston 6 and the inner circumference of the bore 4. This equalizes the pressure below and above the piston 6. The piston surface are below the piston, however, is greater than that above the piston, so that an upwardly directed force will be exerted on the piston 6, as seen in the figure.

When a pressurized fluid is supplied to the channel 11, this fluid will press the piston-shaped member 7 with the balls 8 resting thereon upwards against the spring force of the spring 10. Since the wall 9 against which the balls lie has a tapering shape, the balls will be pressed against the piston rod 5 traversely to the longitudinal axis of the piston rod 5, whereby the piston rod is blocked against a displacement in its longitudinal direction. The blocking of the piston rod will be again the moment the fluid is allowed to escape through the conduit connected to the end of the channel 11, so that the spring 10 can press the balls 8 with the piston-shaped member 7 back again.

It will be obvious that the piston rod 5 may thus be clamped with respect to the housing 1 in any position desired. Clamping of a piston rod 5 supporting an object in this manner will also render possible a stable support of the relevant object. The use of the elongate body 2, in which bore 4 for the piston rod 5 with the piston 6 and the channels 11 and 12 extending parallel thereto are provided, contributes to a compact construction of the housing 1. This also renders it possible for fluid supply and discharge conduits for the operation of the supporting device to be provided at the end of the housing 1 remote from that end of the housing 1 from which the piston rod 5 projects. This prevents the presence of uncomfortable projections at the side of the housing. The possibility of arranging several supporting devices closely next to one another is created thereby.

Obviously, amplifications and/or modifications of the supporting device described above and depicted in the Figure are conceivable within the spirit and scope of protection of the invention. Thus, for example, wedge-shaped clamping members may be used instead of ball-shaped clamping members.

What is claimed is:

1. A supporting device for supporting substrates in a component placement machine, which supporting device is provided with a housing (1), with a piston rod (5) arranged in the housing (1) and movable in its longitudinal direction by means of a pressurized fluid, exactly one end of said piston rod (5) projecting outside the housing (1), and with a locking mechanism (7 to 9) by means of which a displacement of the piston rod (5) in its longitudinal direction can be prevented, which locking mechanism (7 to 9) is provided with clamping members (B) displaceable transversely to the longitudinal direction of the piston rod (5) by adjusting means (7) between an active position, in which a displacement of the piston rod (5) in its longitudinal direction is prevented, and an idle position, in which the piston rod (5) can be displaced in its longitudinal direction, characterized in that the clamping members (8) are arranged in the housing (1) such that they directly engage the piston rod (5) in the active position of the clamping members (8).

2. A supporting device as claimed in claim 1, characterized in that the clamping members (8) are located adjacent that end of the housing (1) where the piston rod (5) projects outside the housing.

3. A supporting device as claimed in claim 1, characterized in that the clamping members (8) are displaceable parallel to the longitudinal direction of the piston rod (5) along a conical guide surface (9) formed in the housing by means of a piston member (7) located in the housing and displaceable by means of a pressurized fluid, which piston member (7) bears on the clamping members (8).

4. A supporting device as claimed in claim 3, characterized in that a bore (4) for accommodation of the piston rod (5) is provided in the housing (1), which piston rod (5) is provided with a piston (6) at its end remote from the end projecting from the housing (1), and that at least one channel (11) extending parallel to the bore is provided for the supply of fluid to the space of the housing (1) accommodating the piston-shaped member (7).

5. A supporting device as claimed in claim 4, characterized in that the channel (11) issues with its end remote from the space accommodating the piston-shaped member (7) adjacent that end of the housing (1) which is remote from the end of the housing (1) from which the piston rod (5) projects.

6. A supporting device as claimed in claim 4, characterized in that the external diameter of the piston (6) is slightly smaller than the internal diameter of the bore (4) accommodating the piston rod (5).

7. A supporting device as claimed in claim 4, characterized in that closure members are provided for controlling the supply and discharge of fluid into and from the bore (4) and/or the channel (11).

8. A supporting device as claimed in claim 1 one of the preceding claims, characterized in that a further channel (12) is provided in the housing, which channel extends parallel to a bore (4) provided in the housing (1) and accommodating the piston rod (5), said further channel (12) being in open communication with the bore (4) accommodating the piston rod (5) for the supply of fluid to the bore accommodating the piston rod via a passage (13) in the housing (10) adjacent the locking mechanism (7 to 9) accommodated in the housing (1).

9. A supporting device as claimed in claim 8, characterized in that the further channel (12) issues adjacent the end of the housing (1) remote from the end of the piston rod (5) projecting from the housing (1).

* * * * *